United States Patent [19]

Inami

[11] Patent Number: 5,243,346
[45] Date of Patent: Sep. 7, 1993

[54] DIGITAL-TO-ANALOG CONVERTING DEVICE USING DECODERS AND PARALLEL-TO-SERIAL CONVERTERS

[75] Inventor: Daijiro Inami, Tokyo, Japan
[73] Assignee: NEC Corporation, Tokyo, Japan
[21] Appl. No.: 810,678
[22] Filed: Dec. 19, 1991

[30] Foreign Application Priority Data
Dec. 19, 1990 [JP] Japan ................. 2-411724

[51] Int. Cl.[5] .......................................... H03M 1/66
[52] U.S. Cl. ...................................... 341/144; 341/101
[58] Field of Search ............... 341/144, 126, 141, 146, 341/152, 153, 118, 60, 61, 53, 101, 143; 307/260, 261; 377/42

[56] References Cited

U.S. PATENT DOCUMENTS 4,591,832  5/1986  Fling et al. ................. 341/146
4,929,947  5/1990  Toyama ...................... 341/146

Primary Examiner—A. D. Pellinen
Assistant Examiner—Brian K. Young
Attorney, Agent, or Firm—Sughrue, Mion, Zinn, Macpeak & Seas

[57] ABSTRACT

In a digital-to-analog converting device for converting an input digital signal into an output analog signal, a converting circuit converts the input digital signal into a first and a second digital signal which are alternatingly produced in parallel in response to clock pulses. A first and a second decoder are for decoding the first and the second digital signals into a first and a second decoded parallel digital signal. A first and a second parallel-serial converter are for converting the first and the second decoded parallel digital signals into a first and a second serial digital signal in response to an oversampling clock pulses. A first and a second digital-to-analog converter are for converting the first and the second serial digital signals into a first and a second analog signal. An analog adder adds the first and the second analog signals into a sum analog signal. An analog integrator is for integrating the sum analog signal into the output analog signal.

3 Claims, 4 Drawing Sheets

1

DIGITAL-TO-ANALOG CONVERTING DEVICE USING DECODERS AND PARALLEL-TO-SERIAL CONVERTERS

BACKGROUND OF THE INVENTION

This invention relates to a digital-to-analog converting device which is for converting a serial input digital signal into an output analog signal.

A conventional digital-to-analog converting device comprises a digital processing unit, a digital-to-analog converter, and an analog integrator. As will later be described more in detail, the conventional digital-to-analog converting device has a large size and a high power consumption.

SUMMARY OF THE INVENTION

It is therefore an object of this invention to provide a digital-to-analog converting device which has a small size and a low power consumption.

Other objects of this invention will become clear as the description proceeds.

According to this invention, there is provided a digital-to-analog converting device which is for converting an input digital signal into an output analog signal and comprises: (A) converting circuit means supplied with the input digital signal and a sequence of clock pulses for converting the input digital signal into a first and a second digital signal which are produced in parallel alternatingly in response to the clock pulses; (B) first decoder means connected to the converting circuit means for decoding the first digital signal into a first decoded parallel digital signal; (C) second decoder means connected to the converting circuit means for decoding the second digital signal into a second decoded parallel digital signal; (D) first parallel-serial converter means connected to the first decoded means and supplied with a sequence of oversampling clock pulses for converting the first decoded parallel digital signal into a first serial digital signal in response to the oversampling clock pulses; (E) second parallel-serial converter means connected to the second decoder means and supplied with the sequence of the oversampling clock pulses for converting the second decoded parallel digital signal into a second serial digital signal in response to the oversampling clock pulses; (F) first digital-to-analog converter means connected to the first parallel-serial converter means for converting the first serial digital signal into a first analog signal; (G) second digital-to-analog converter means connected to the second parallel-serial converter means for converting the second serial digital signal into a second analog signal; (H) analog adder means connected to the first and the second digital-to-analog converter means for adding the first analog signal and the second analog signal to produce a sum analog signal; and (I) analog integrator means connected to the analog adder means for integrating the sum analog signal into the output analog signal.

DESCRIPTION OF THE PREFERRED EMBODIMENT

Figure 1:
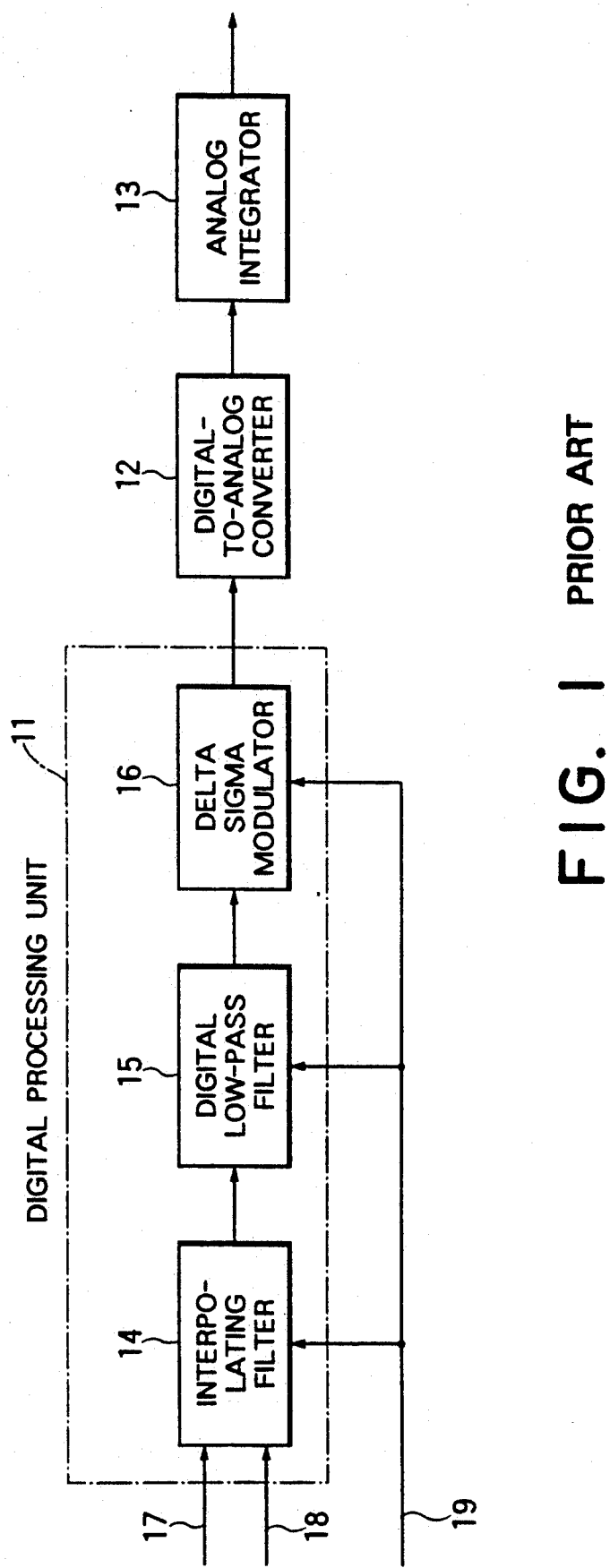
FIG. 1 is a block diagram of a conventional digital-to-analog converting device.

Referring to FIG. 1, a conventional digital-to-analog device will be described first for a better understanding of this invention. The conventional digital-to-analog converting device comprises a digital processing unit 11, a digital-to-analog converter 12 connected to the digital processing unit 11, and an analog integrator 13 connected to the digital-to-analog converter 12.

The digital processing unit 11 comprises an interpolating filter 14, a digital low-pass filter 15, and a delta sigma modulator 16. The interpolating filter 14 is supplied with an input digital signal 17, a clock signal 18, namely, a sequence of clock pulses, and an oversampling signal 19, that is, a sequence of oversampling pulses. The interpolating filter 14 produces an interpolated signal in response to the serial input digital signal 17, the clock signal 18, and the oversampling clock signal 19. Connected to the interpolating filter 14 and supplied with the oversampling clock signal 19, the digital low-pass filter 15 filters the interpolated signal to produce a filtered signal in response to the oversampling clock signal 19. The delta sigma modulator 16 is connected to the digital low-pass filter and supplied with the oversampling clock signal 19. The delta sigma modulator 16 modulates the filtered signal into a modulated signal in response to the oversampling clock signal 19.

Connected to the delta sigma converter 16, the digital-to-analog converter 12 converts the modulated signal into an analog signal. Connected to the digital-to-analog converter 12, the analog integrator 13 integrates the analog signal into an output analog signal.

In the conventional device, both of the digital low pass filter 15 and the delta sigma modulator 16 have a large size and a high power consumption.

Figure 2:
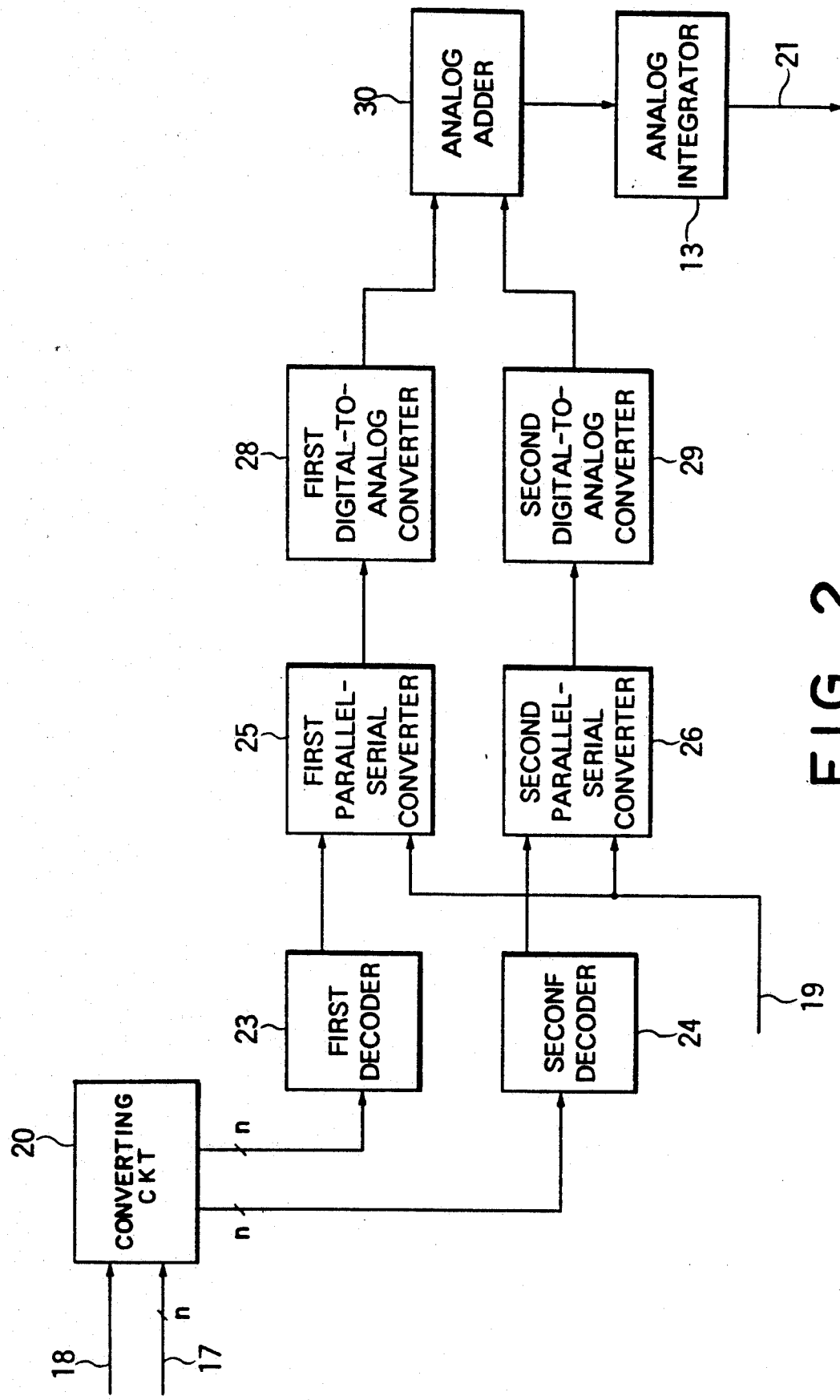
FIG. 2 is a block diagram of a digital-to-analog converting device according to an embodiment of this invention.

Turning to FIG. 2, the description will proceed to a digital-to-analog converting device according to a preferred embodiment of this invention. The illustrated digital-to-analog converting device is for converting an input digital signal into an output analog signal 21. The input digital signal will be designated by the reference numeral 17. The input digital signal 17 comprises first through n-th serial input digital signals each of which is a sequence of input digital pulses. The digital-to-analog converting device comprises a converting circuit 20. The converting circuit 20 is connected to a clock signal generator (not shown) and an encoding circuit (not shown). The converting circuit 20 is supplied with the input digital signal 17 from the encoding circuit and the clock signal 18 from the clock signal generator. More particularly, the converting circuit 20 is supplied in parallel with the first through the n-th serial input digital signals of the input digital signal 17.

The converting circuit 20 is connected to a first decoder 23 and a second decoder 24. The first and the second decoders 23 and 24 receive first and second converted parallel signals, respectively, and are respectively connected to a first parallel-serial converter 25 and a second parallel-serial converter 26. The first and the second parallel-serial converters 25 and 26 are supplied with the oversampling clock signal 19. The first and the second parallel-serial converters 25 and 26 are respectively connected to a first digital-to-analog converter 28 and a second digital-to-analog converter 29. The first and the second digital-to-analog converters 28 and 29 are connected to an analog adder 30. The analog adder 30 is connected to an analog integrator which is indicated by the reference numeral 13.

Figure 3:
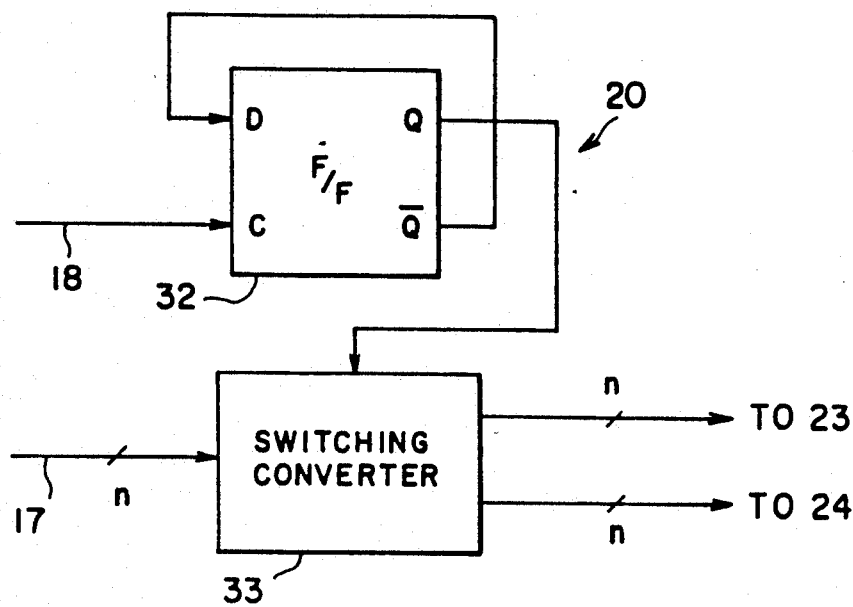
FIG. 3 is a circuit diagram of a serial-parallel converter for use in the digital-to-analog converting device illustrated in FIG. 2.

Turning to FIG. 3, the converting circuit 20 comprises a flip-flop 32 and a switching converter 33. A clock input terminal C of the flip-flop 32 is connected to the clock signal generator and supplied with the clock signal 18. A positive output terminal Q of the flip-flop 32 is connected to a converter input terminal of the switching converter 33. An inverted output terminal $\overline{Q}$ of the flip-flop 32 is connected to a data input terminal D of the flip-flop 32. The switching converter 33 is supplied with the input digital signal 17 and a positive output signal from the positive output terminal Q of the flip-flop 32. The switching converter 33 has a first and a second output terminal. The first output terminal of the switching converter 33 is connected to the first decoder 23 (FIG. 2). The second output terminal of the switching converter 33 is connected to the second decoder 24 (FIG. 2).

When the flip-flop 32 is supplied with the clock signal 18 from the clock signal generator, the positive output signal from the positive output terminal Q alternatingly changes between a logic "1" level and a logic "0" level in a clock period. In response to the positive output signal from the positive output terminal Q, the switching converter 33 outputs the input digital signal 17 to one of the first and the second decoders 23 and 24 (FIG. 2). It is assumed that the input digital signal supplied and the first decoder 23 is a first digital signal and the input digital signal supplied to the second decoder 24 is a second digital signal.

Turning back to FIG. 2, the first decoder 23 is supplied with the first digital signal from the converting circuit 20. The first decoder 23 decodes the first digital signal into a first decoded parallel digital signal to supply the first decoded parallel digital signal to the first parallel-serial converter 25. The first decoder 23 has the same functions as the digital low-pass filter 15 and the delta sigma modulator 16 of the conventional digital-to-analog converting device shown in FIG. 1. For example, the first decoder 23 is a ROM which is addressed by the first digital signal.

The second decoder 24 is supplied with the second digital signal from the converting circuit 20. The second decoder 24 decodes the second digital signal into a second decoded parallel digital signal to supply the second decoded parallel digital signal to the second parallel-serial converter 26. The second decoder 24 has the same function and construction as the first decoder 23.

The first parallel-serial converter 25 is supplied with the oversampling clock signal 19 and the first decoded parallel digital signal from the first decoder 23. The first parallel-serial converter 25 converts the first decoded parallel digital signal into a first serial digital signal in response to the oversampling clock signal 19 by successively producing the decoded pulses of the time sequence in synchronism with the oversampling clock pulses. The frequency of the oversampling clock signal 19 is determined by the frequency of the clock signal 18 and the bit number of the first decoded parallel digital signal. The frequency $f_s$ of the oversampling clock signal 19 is represented as a following equation:

$$f_s = \tfrac{1}{2} n \cdot f_0,$$

where n is a bit number of the first decoded parallel digital signal and $f_0$ is a frequency of the clock signal 18. The first parallel-serial converter 25 supplies the first serial digital signal to the first digital-to-analog converter 28.

The second parallel-serial converter 26 is supplied with the oversampling clock signal 19 and the second decoded parallel digital signal from the second decoder 24. The second parallel-serial converter 26 converts the second decoded parallel digital signal into a second serial digital signal in response to the oversampling clock signal 19. The second parallel-serial converter 26 supplies the second serial digital signal to the second digital-to-analog converter 29.

Figure 4:
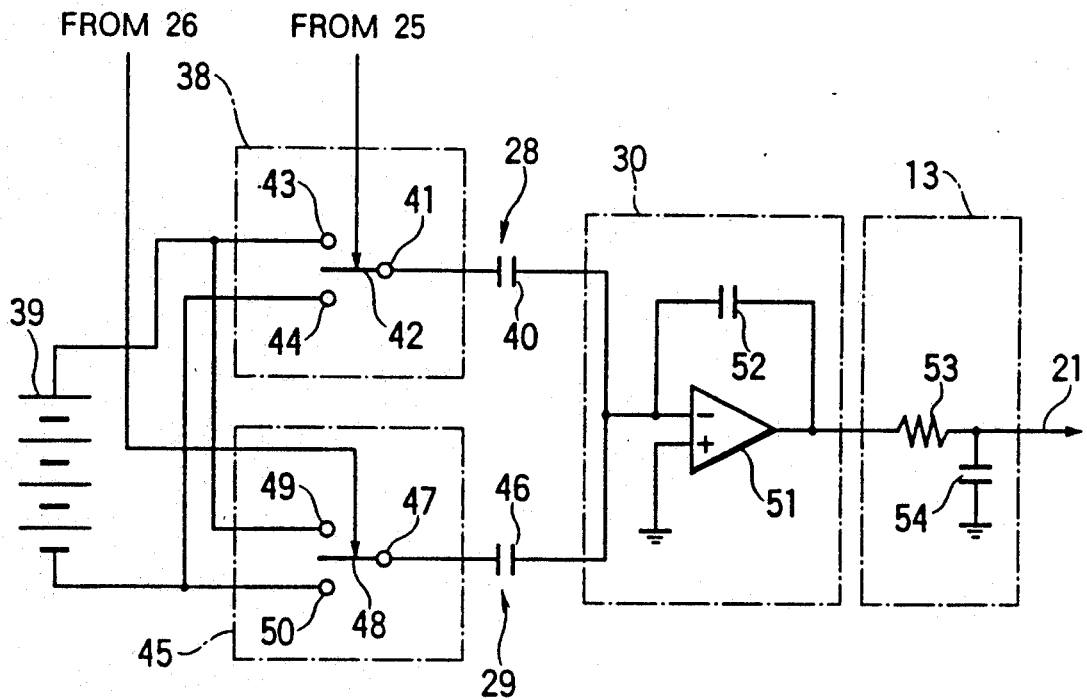
FIG. 4 is a circuit diagram of a first and a second digital-to-analog converter and other parts of the digital-to-analog converting device illustrated in FIG. 2.

Turning to FIG. 4, the first digital-to-analog converter 28 comprises a first switching circuit 38 connected to the first parallel-serial converter 25, a power supply 39 connected to the first switching circuit 38, and a first capacitor 40 connected between the first switching circuit 38 and the analog adder 30. The first switching circuit 38 comprises a first base terminal 41, a first switch arm 42 connected to the first base terminal 41 and to an output terminal of the first parallel-serial converter 25, a first high level terminal 43 connected to a positive voltage terminal of the power supply 39, and a first low level terminal 44 connected to a negative voltage terminal of the power supply 39. Supplied with the first serial digital signal from the first parallel-serial converter 25, the first digital-to-analog converter 28 converts the first serial digital signal into a first analog signal to supply the first analog signal to the analog adder 30.

In the second digital-to-analog converter 29, a second switching circuit 45 is connected to the second parallel-serial converter 26 and to the power supply 39. A second capacitor 46 is connected between the second switching circuit 45 and the analog adder 30. The second switching circuit 45 comprises a second base terminal 47, a second switch arm 48 connected to the second base terminal 47 and to an output terminal of the second parallel-serial converter 26, a second high level terminal 49 connected to the positive voltage terminal of the power supply 39, and a second low level terminal 50 connected to the negative voltage terminal of the power supply 39. Supplied with the second serial digital signal from the second parallel-serial converter 26, the second digital-to-analog converter 29 converts the second serial digital signal into a second analog signal to supply the second analog signal to the analog adder 30.

The analog adder 30 is supplied with the first and the second analog signals from the first and the second digital-to-analog converters 28 and 29. The analog adder 30 comprises an operational amplifier 51 having an inverted and a non-inverted input terminal and an amplifier output terminal. The inverted input terminal of the amplifier 51 is connected to the first and the second capacitors 40 and 46. The non-inverted input terminal of the amplifier 51 is connected to ground. A third capacitor 52 is connected between the non-inverted input terminal and the amplifier output terminal of the amplifier 51. Supplied with the first analog signal through the first capacitor 40 and the second analog signal from the second capacitor 46, the analog adder 30 adds the first analog signal and the second analog signal to produce a sum analog signal.

The analog integrator 13 is supplied with the sum analog signal from the operational amplifier 51. The analog integrator 13 comprises a resistor 53 having an input end connected to the output terminal of the amplifier 51 and an output end grounded through a fourth capacitor 54. Supplied with the sum analog signal, the analog integrator 31 integrates the sum analog signal into the output analog signal 21.

Figure 5:
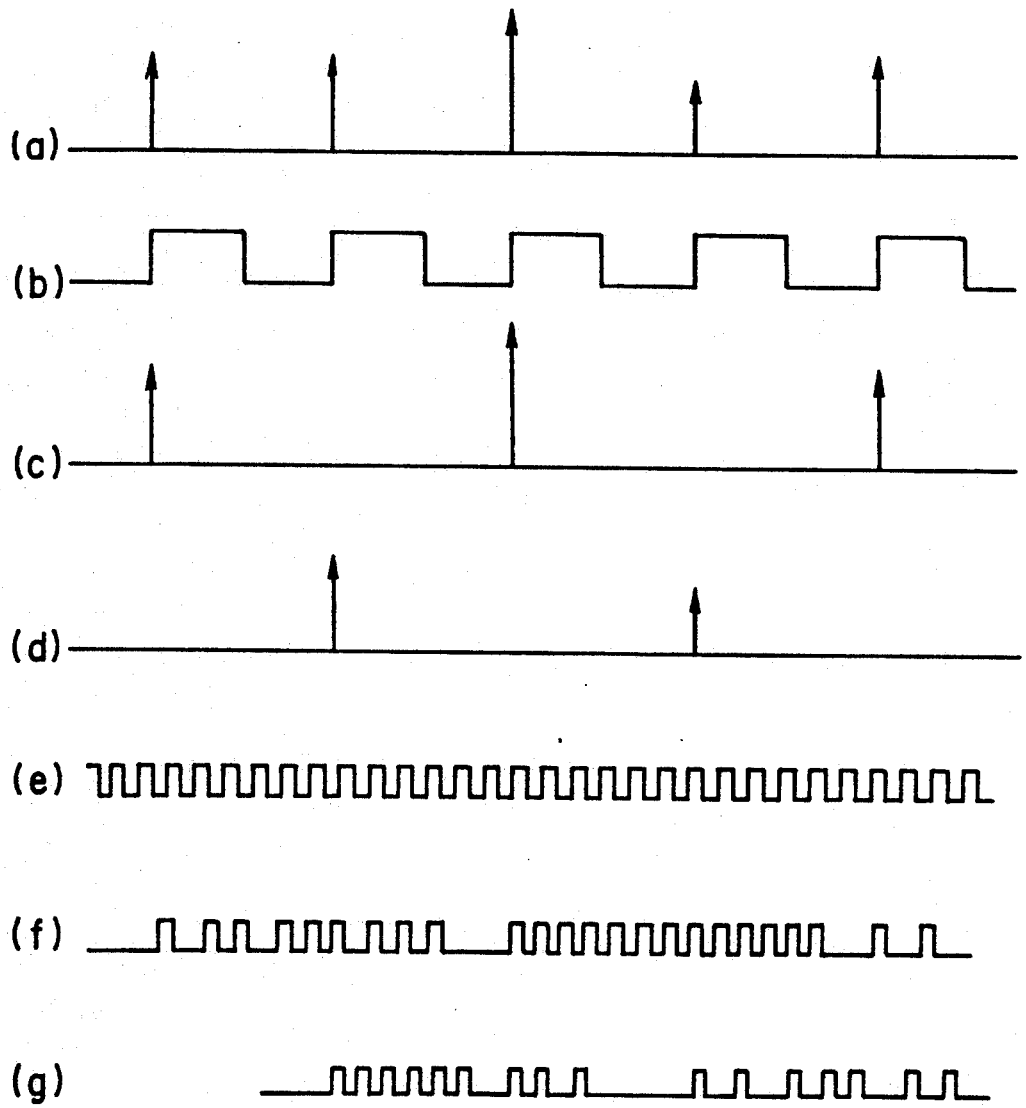
FIGS. 5($a$) to 5($g$) are schematic waveform diagrams for use in describing operation of the digital-to-analog converting device illustrated in FIG. 2.

Referring to FIGS. 5(a) to 5(g), operation will be described as regards the digital-to-analog converting device illustrated with reference to FIGS. 2 to 4. The input digital signal 17 is produced from the encoding circuit with a waveform exemplified in FIG. 5(a). The clock signal 18 is produced from the clock signal generator with a waveform depicted in FIG. 5(b). FIGS. 5(c) and 5(d) represent waveforms of the first and the second digital signals which are produced from the converting circuit 20. FIG. 5(e) represents a waveform of the oversampling clock signal 19. The first and the second serial digital signals are produced from the first and the second parallel-serial converters 25 and 26 with waveforms shown in FIGS. 5(f) and 5(g).

Referring to FIGS. 2, 5(c), and 5(d), each of the first and the second decoders 23 and 24, the first and the second parallel-serial converters 25 and 26, and the first and the second digital-to-analog converters 28 and 29 may have a long operating time and are not subjected to interference with the input digital pulses which are adjacent to each other in the input digital signal 17. This is because the converting circuit 20 converts the input digital signal 17 into the first and the second digital signals which are alternatingly produced in parallel in response to the clock pulses.

What is claimed is:

1. A digital-to-analog converting device which is for converting an input digital signal into an output analog signal and which comprises:

converting circuit means supplied with said input digital signal and a sequence of clock pulses for converting said input digital signal into a first and a second digital signal which are produced in parallel alternatingly in response to said clock pulses;

first decoder means connected to said converting circuit means for decoding said first digital signal into a first decoded parallel digital signal;

second decoder means connected to said converting circuit means for decoding said second digital signal into a second decoded parallel digital signal;

first parallel-serial converter means connected to said first decoder means and supplied with a sequence of oversampling clock pulses for converting said first decoded parallel digital signal into a first serial digital signal in response to said oversampling clock pulses;

second parallel-serial converter means connected to said second decoder means and supplied with said sequence of said oversampling clock pulses for converting said second decoded parallel digital signal into a second serial digital signal in response to said oversampling clock pulses;

first digital-to-analog converter means connected to said first parallel-serial converter means for converting said first serial digital signal into a first analog signal;

second digital-to-analog converter means connected to said second parallel-serial converter means for converting said second serial digital signal into a second analog signal;

analog adder means connected to said first and said second digital-to-analog converter means for adding said first analog signal and said second analog signal to produce a sum analog signal; and analog integrator means connected to said analog adder means for integrating said sum analog signal into said output analog signal.

2. A digital-to-analog converting device as claimed in claim 1, wherein said converting circuit means comprises:

a flip-flop having a clock input terminal supplied with said clock pulses, a data input terminal, and an inverted output terminal connected to said data input terminal; and a switching converter connected to a positive output terminal of said flip-flop and supplied with said input digital signal for converting said input digital signal into said first and said second digital signals which are produced in parallel alternatingly in response to an output signal of said flip-flop.

3. A digital-to-analog converting device as claimed in claim 1, wherein said first and second decoder means comprise first and second ROMs, respectively, that are addressed by said first and second digital signals output by said converting circuit means, said first and second ROMs outputting first and second decoded parallel digital signals based on first and second digital signals, respectively.

* * * * *